(12) United States Patent
Wu et al.

(10) Patent No.: US 11,557,896 B1
(45) Date of Patent: Jan. 17, 2023

(54) ELECTROSTATIC DISCHARGE PROTECTION CIRCUIT

(71) Applicant: Winbond Electronics Corp., Taichung (TW)

(72) Inventors: Nai Sheng Wu, Taichung (TW); Chao-Lung Wang, Taichung (TW); Chia-Lung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/411,020

(22) Filed: Aug. 24, 2021

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC ............................ H02H 9/046; H01L 27/0248
USPC ........................................................... 361/56
See application file for complete search history.

(56) References Cited

U.S. PATENT DOCUMENTS

| | | | |
|---|---|---|---|
| 5,086,365 A | 2/1992 | Lien | |
| 5,631,793 A | 5/1997 | Ker et al. | |
| 6,690,561 B2 | 2/2004 | Hung et al. | |
| 8,243,403 B2 * | 8/2012 | Liang | H02H 9/046 361/111 |
| 10,693,292 B2 * | 6/2020 | Tang | H02H 9/041 |
| 2010/0296212 A1 * | 11/2010 | Liang | H02H 9/046 361/56 |
| 2015/0049403 A1 * | 2/2015 | de Raad | H03K 19/00315 361/56 |
| 2015/0162746 A1 * | 6/2015 | Ikeda | H02H 9/046 361/56 |
| 2022/0223581 A1 * | 7/2022 | Mysore Rajagopal | H01L 27/0259 |

FOREIGN PATENT DOCUMENTS

| | | |
|---|---|---|
| JP | 6154700 | 6/2017 |
| TW | 200511556 | 3/2005 |
| TW | I264106 | 10/2006 |
| TW | 201042747 | 12/2010 |

OTHER PUBLICATIONS

"Office Action of Taiwan Counterpart Application", dated Jan. 5, 2022, p. 1-p. 5.

* cited by examiner

*Primary Examiner* — Dharti H Patel
(74) *Attorney, Agent, or Firm* — JCIPRNET

(57) ABSTRACT

Provided is an electrostatic discharge protection circuit, including a first resistor, a first transistor, a second resistor, and a second transistor. The first resistor has a first end coupled to a first power rail. The first transistor has a first end coupled to the first power rail, and a control end of the first transistor is coupled to a second end of the first resistor. The second resistor is coupled between a second end of the first transistor and a second power rail. The second transistor has a first end coupled to the first power rail, a control end of the second transistor is coupled to the second end of the first transistor, and a second end of the second transistor is coupled to the second power rail.

13 Claims, 3 Drawing Sheets

US 11,557,896 B1

ELECTROSTATIC DISCHARGE PROTECTION CIRCUIT

BACKGROUND

Technical Field

The disclosure relates to an electrostatic discharge protection circuit, and in particular to an electrostatic discharge protection circuit that may improve conduction efficiency of an electrostatic discharge transistor.

Description of Related Art

In the prior art, in order to ensure that an integrated circuit is not damaged by electrostatic discharge, an electrostatic discharge protection circuit is usually added to the integrated circuit to provide a dissipating path for an electrostatic discharge current and prevent circuit elements from being damaged. In the conventional technology, a power clamp circuit is often disposed between power rails as the electrostatic discharge protection circuit.

In order to effectively achieve an electrostatic discharge protection effect, how to effectively improve conduction efficiency of an electrostatic discharge transistor is an important topic. In the conventional technology, a complicated trigger circuit is often disposed and employed in response to the occurrence of an electrostatic discharge phenomenon for conducting the electrostatic discharge transistor. This approach leads to an increase in circuit area because the trigger circuit occupies extra layout area.

Therefore, how to effectively improve the conduction efficiency of the electrostatic discharge transistor within a limited layout region is an important topic for people skilled in the art.

SUMMARY

The disclosure provides an electrostatic discharge protection circuit, which may improve conduction efficiency of an electrostatic discharge transistor with limited layout area.

The electrostatic discharge protection circuit of the disclosure includes a first resistor, a first transistor, a second resistor, and a second transistor. The first resistor has a first end coupled to a first power rail. The first transistor has a first end coupled to the first power rail, and a control end of the first transistor is coupled to a second end of the first resistor. The second resistor is coupled between a second end of the first transistor and a second power rail. The second transistor has a first end coupled to the first power rail, a control end of the second transistor is coupled to the second end of the first transistor, and a second end of the second transistor is coupled to the second power rail.

Based on the above, the electrostatic discharge protection circuit of the disclosure conducts the first transistor through a delay effect of the first resistor and conducts the second transistor through an electrostatic discharge current dissipated by the first transistor in conjunction with the second resistor. In this way, the second transistor as an electrostatic discharge transistor may be effectively conducted. In conjunction with the first transistor, performance of the electrostatic discharge protection circuit may be effectively improved.

DESCRIPTION OF THE EMBODIMENTS

Figure 1:
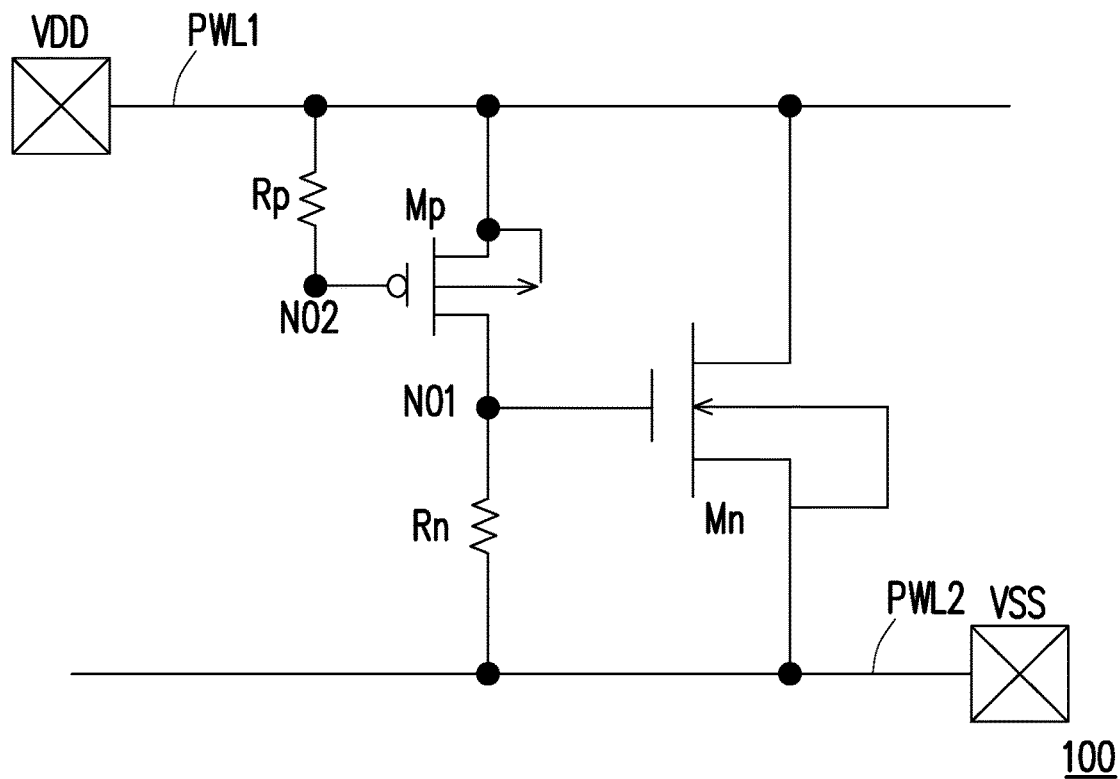
FIG. 1 is a schematic view of an electrostatic discharge protection circuit according to an embodiment of the disclosure.

With reference to FIG. 1, an electrostatic discharge protection circuit 100 includes resistors Rp and Rn as well as transistors Mp and Mn. In this embodiment, the resistors Rp, Rn, and the transistor Mp constitute a trigger circuit, and the transistor Mn serves as a main element of electrostatic discharge. A first end of the resistor Rp is coupled to a power rail PWL1, and a second end of the resistor Rp is coupled to a node N02 and is coupled to a control end of the transistor Mp. A first end of the transistor Mp is coupled to the power rail PWL1, and a second end of the transistor Mp is coupled to a node N01 and a first end of the resistor Rn. The resistor Rn is coupled between the second end of the transistor Mp and a power rail PWL2.

On the other hand, a first end of the transistor Mn is coupled to the power rail PWL1, a second end of the transistor Mn is coupled to the power rail PWL2, and a control end of the transistor Mn is coupled to the node N01.

In this embodiment, the power rail PWL1 is for receiving an operation power VDD, and the power rail PWL2 is for receiving a ground power VSS. On the other hand, the transistor Mp is a P-type transistor, and the transistor Mn may be an N-type transistor.

In a normal operation mode (a non-electrostatic discharge mode), when an integrated circuit to which the electrostatic discharge protection circuit 100 belongs is normally supplied with the operation power VDD, the transistors Mp and Mn are both turned off. At this time, the electrostatic discharge protection circuit 100 remains closed, which does not affect the normal operation of the integrated circuit. In addition, in an electrostatic discharge mode, when an electrostatic discharge phenomenon occurs in the power rail PWL1 (the power rail PWL2 at this time receives the ground power VSS), the power rail PWL1 is applied with a fast-rising positive pulse. At this time, the resistor Rp may be used to delay the speed at which the voltage on the control end (the node N02) of the transistor Mp rises. In this way, between the first end and the control end of the transistor Mp exists a voltage difference, and the transistor Mp is conducted. At the same time, the conducted transistor Mp may dissipate a first electrostatic discharge current, which is a part generated by the electrostatic discharge phenomenon.

The first electrostatic discharge current dissipated by the transistor Mp may flow through the resistor Rn. The resistor Rn may increase the voltage on the node N01 according to the first electrostatic discharge current and generate a voltage difference between the node N01 and the power rail PWL2. This voltage difference is applied between the control end and the second end of the transistor Mn for conducting the transistor Mn.

The conducted transistor Mn may form a current dissipating path between the power rails PWL1 and PWL2 for dissipating a second electrostatic discharge current, which is another part generated by the electrostatic discharge phenomenon.

In this embodiment, a channel width-to-length ratio of the transistor Mn may be greater than a channel width-to-length ratio of the transistor Mp, and the first electrostatic discharge current is less than the second electrostatic discharge current.

In this embodiment, the channel width-to-length ratio of the transistor Mn may be approximately 8 times the channel width-to-length ratio of the transistor Mp. The resistor Rn may be tens of ohms, and the resistor Rp may be hundreds of kiloohms. Of course, the above values are only for reference. The electrical parameters of the transistor Mn, the transistor Mp, the resistor Rp, and the resistor Rn may be adjusted according to actual conditions and are not subject to certain limitations.

When the electrostatic discharge phenomenon occurs, the electrostatic discharge protection circuit 100 of this embodiment may dissipate part of the electrostatic discharge current by conducting the transistor Mp and increase the voltage of the node N01 in correspondence with the electrostatic discharge current to rapidly conduct the transistor Mn and complete the dissipation of the electrostatic discharge current. The conduction efficiency of the electrostatic discharge protection circuit 100 of this embodiment is significantly improved, and the effect of electrostatic discharge protection may also be enhanced at the same time.

Figure 2:
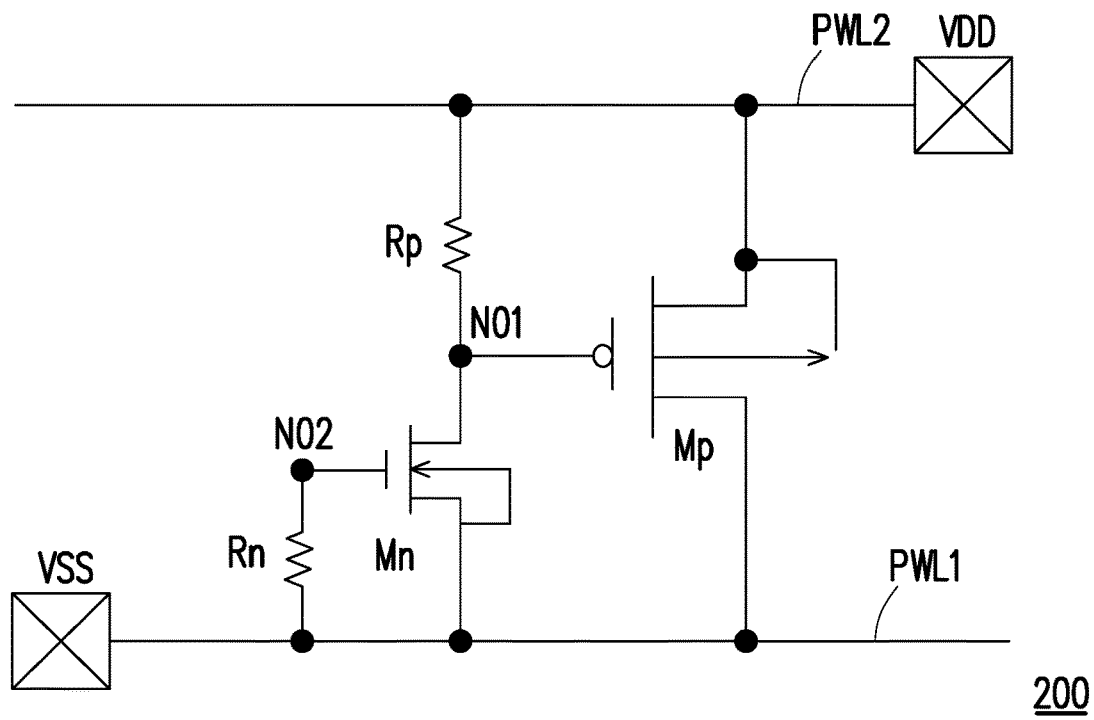
FIG. 2 is a schematic view of an electrostatic discharge protection circuit according to another embodiment of the disclosure.

With reference to FIG. 2, an electrostatic discharge protection circuit 200 includes the resistors Rp and Rn as well as the transistors Mn and Mp. In this embodiment, the resistors Rp, Rn, and the transistor Mn constitute a trigger circuit, and the transistor Mp serves as a main element of electrostatic discharge. The first end of the resistor Rn is coupled to the power rail PWL1, and the second end of the resistor Rn is coupled to the node N02 and is coupled to the control end of the transistor Mn. The first end of the transistor Mp is coupled to the power rail PWL1, and the second end of the transistor Mn is coupled to the node N01 and is coupled to the first end of the resistor Rp. The resistor Rp is coupled between the second end of the transistor Mn and the power rail PWL2.

On the other hand, the first end of the transistor Mp is coupled to the power rail PWL1, the second end of the transistor Mp is coupled to the power rail PWL2, and the control end of the transistor Mp is coupled to the node N01.

In this embodiment, the power rail PWL1 is for receiving the ground power VSS, and the power rail PWL2 is for receiving the operation power VDD. On the other hand, the transistor Mn is an N-type transistor, and the transistor Mp may be a P-type transistor.

In the normal operation mode (the non-electrostatic discharge mode), when an integrated circuit to which the electrostatic discharge protection circuit 200 belongs is normally supplied with the operation power VDD, the transistors Mp and Mn are both turned off. At this time, the electrostatic discharge protection circuit 200 remains closed, which does not affect the normal operation of the integrated circuit. In addition, in the electrostatic discharge mode, when an electrostatic discharge phenomenon occurs in the power rail PWL1 (the power rail PWL2 at this time receives the ground power VSS), the power rail PWL1 is applied with a fast-rising positive pulse. At this time, the resistor Rn may be used to delay the speed at which the voltage on the control end (the node N02) of the transistor Mn rises. In this way, between the first end and the control end of the transistor Mn exists a voltage difference, and the transistor Mn is conducted. At the same time, the conducted transistor Mn may dissipate the first electrostatic discharge current, which is a part generated by the electrostatic discharge phenomenon.

The first electrostatic discharge current dissipated by the transistor Mn may flow through the resistor Rp. The resistor Rp may generate a voltage difference between the node N01 and the power rail PWL2 according to the first electrostatic discharge current. This voltage difference may decrease the voltage of the control end of the transistor Mp and conduct the transistor Mp.

The conducted transistor Mp may form a current dissipating path between the power rails PWL1 and PWL2 for dissipating the second electrostatic discharge current, which is another part generated by the electrostatic discharge phenomenon.

In this embodiment, the channel width-to-length ratio of the transistor Mp may be greater than the channel width-to-length ratio of the transistor Mn, and the first electrostatic discharge current is less than the second electrostatic discharge current.

Similar to the embodiment of FIG. 1, the electrostatic discharge protection circuit 200 of this embodiment may first conduct the transistor Mn to dissipate part of the electrostatic discharge current when the electrostatic discharge phenomenon occurs. Next, in correspondence with part of the electrostatic discharge current, the transistor Mp may be rapidly conducted, and the dissipation of all the electrostatic discharge current is completed. The action efficiency of the electrostatic discharge protection circuit 200 is effectively improved, and the protection level of electrostatic discharge may also be effectively improved.

Figure 3:
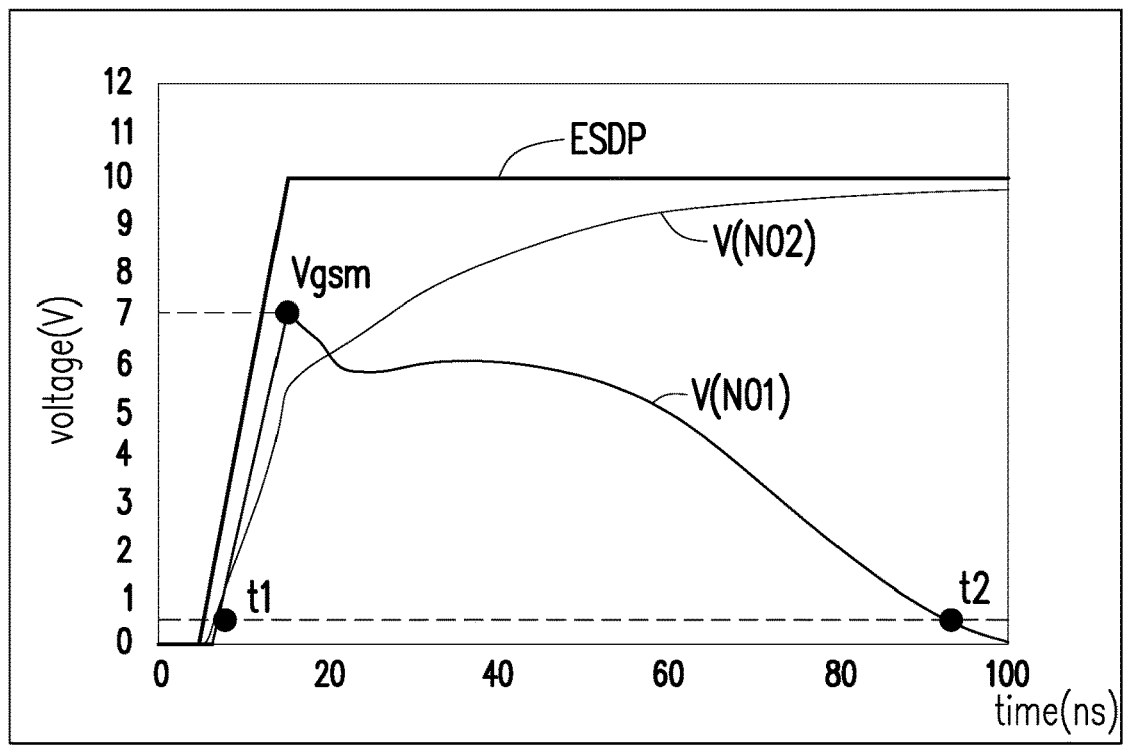
FIG. 3 and FIG. 4 respectively illustrate a node voltage waveform and a node current waveform of an electrostatic discharge protection circuit 100 in an electrostatic discharge phenomenon according to the embodiment of FIG. 1 of the disclosure.
Figure 4:
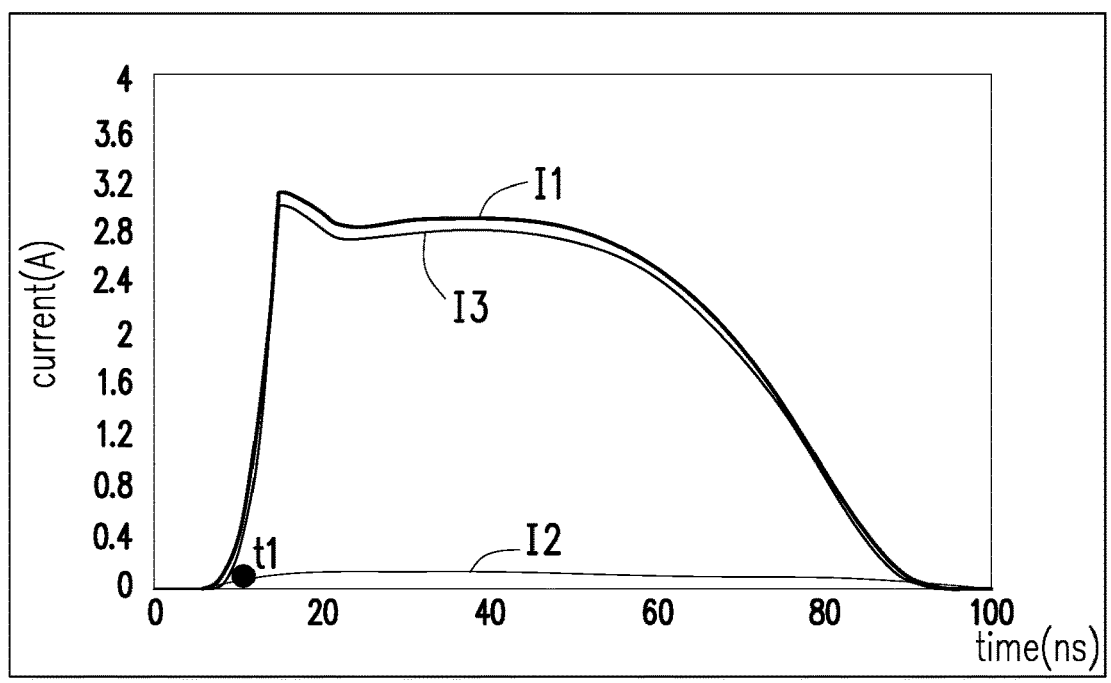

In following, please refer to FIG. 1, FIG. 3, and FIG. 4 together. In FIG. 3, an electrostatic discharge pulse ESDP is applied to the power rail PWL1, and at time t1, a voltage V(N02) of the node N02 starts to rise with the electrostatic discharge pulse ESDP. Based on the effect of the resistor Rp, the rising speed of the voltage V(N02) of the node N02 is slower than the rising speed of the electrostatic discharge pulse ESDP. Accordingly, a negative voltage difference may exist between the control end (the node N02) and the first end (the power rail PWL1) of the transistor Mp for conducting the transistor Mp.

The conducted transistor Mp may provide a current dissipating path and allow the electrostatic discharge current to flow through the resistor Rn and a voltage V(N01) on the node N01 to rise. The transistor Mn may be conducted at the time t1 according to the fast-rising voltage V(N01) on the node N01 for performing the dissipation of the electrostatic discharge current. With the dissipation of the electrostatic discharge current of the transistor Mn, the current flowing through the resistor Rn is reduced, and the voltage V(N01) on the node N01 decreases accordingly to less than the critical voltage of the transistor Mn (for example, equal to 0.32 volts) at time t2.

In FIG. 3, after the time t1, the voltage V(N01) on the node N01 may rapidly rise to a voltage Vgsm. At this time, a voltage difference between the voltage on the power rail PWL1 (equal to the peak voltage of the electrostatic discharge pulse ESDP) and the voltage of the voltage Vgsm may allow the transistor Mp to remain conducted. In this embodiment, the voltage Vgsm is approximately equal to 7.1 volts.

It should be mentioned that in the embodiment of FIG. 3, the transistor Mn remains conducted from the time t1 to the time t2. In other words, the transistor Mn remains conducted for approximately tens of nanoseconds (ns).

In FIG. 4, a curve I1 represents the current in the power rail PWL1, a curve I2 represents the current passing through the transistor Mp, and a curve I3 represents the current passing through the transistor Mn. At the time t1, due to the conducted transistor Mp, the curve I2 is pulled up. In correspondence with the curve I2 pulled up, the transistor Mn is conducted, and the curves I1 and I3 are pulled up synchronously and rapidly. With the reduction of the energy of the electrostatic discharge pulse ESDP, the curves I1 and I3 decrease synchronously. At the time t2, the corresponding transistor Mn is turned off, and the curves I1 and I3 may approach 0 amperes.

Figure 5:
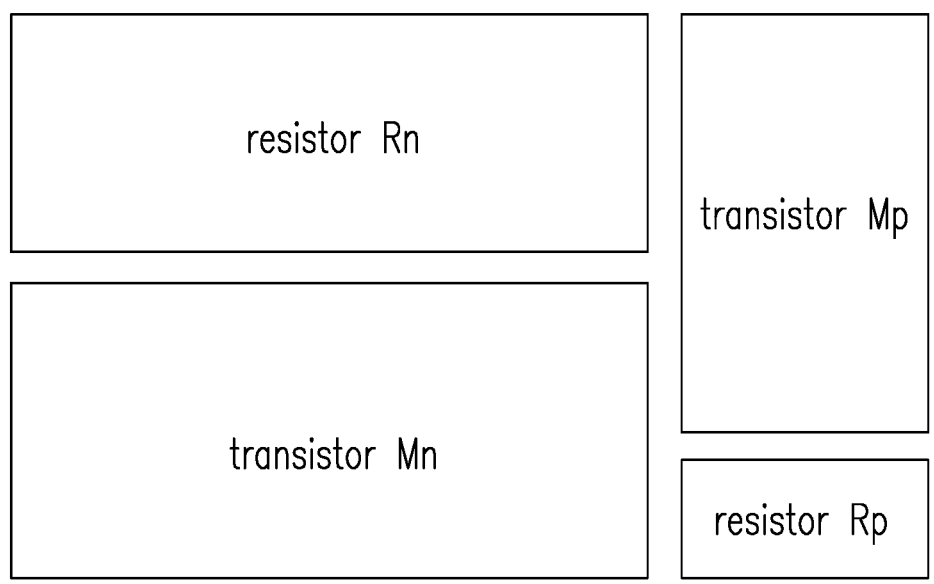
FIG. 5 is a schematic disposition diagram of a layout region of the electrostatic discharge protection circuit according to the embodiments of the disclosure.

It should be mentioned that in the embodiments of the disclosure (with the embodiment shown in FIG. 1 as an example), one of the transistors Mn and Mp is bigger than the other, and one of the resistors Rp and Rn is bigger than the other. Therefore, in the layout, the transistor Mn and the resistor Rn may be disposed in a same row, and the transistor Mp and the resistor Rp may be disposed in another same row as illustrated in FIG. 5, which is a schematic disposition diagram of the layout region of the electrostatic discharge protection circuit according to the embodiments of the disclosure. In this way, the area required for layout may be effectively reduced.

In summary, the electrostatic discharge protection circuit of the disclosure employs one transistor and two resistors to form a trigger circuit, and conducts an electrostatic discharge transistor through the effect of the trigger circuit when an electrostatic discharge phenomenon occurs. In this way, the electrostatic discharge transistor may be rapidly conducted in response to the electrostatic discharge phenomenon, which effectively improves the level of electrostatic discharge protection.

What is claimed is:

1. An electrostatic discharge protection circuit, comprising:
    a first resistor, having a first end coupled to a first power rail;
    a first transistor, having a first end coupled to the first power rail, wherein a control end of the first transistor is coupled to a second end of the first resistor;
    a second resistor, coupled between a second end of the first transistor and a second power rail; and
    a second transistor, having a first end coupled to the first power rail, wherein a control end of the second transistor is coupled to the second end of the first transistor, and a second end of the second transistor is coupled to the second power rail,
    wherein the control end of the first transistor is isolated from the second power rail in both of a normal operation mode and an electrostatic discharge mode.

2. The electrostatic discharge protection circuit according to claim 1, wherein the first power rail is for receiving an operation power, and the second power rail is for receiving a ground power.

3. The electrostatic discharge protection circuit according to claim 2, wherein the first transistor is a P-type transistor, and the second transistor is an N-type transistor.

4. The electrostatic discharge protection circuit according to claim 3, wherein when an electrostatic discharge phenomenon occurs in the first power rail, the first resistor delays a speed at which a voltage on the control end of the first transistor rises, and conducts the first transistor to dissipate a first electrostatic discharge current.

5. The electrostatic discharge protection circuit according to claim 4, wherein when the electrostatic discharge phenomenon occurs in the first power rail, the second resistor increases a voltage on the control end of the second transistor according to the first electrostatic discharge current, and conducts the second transistor to dissipate a second electrostatic discharge current.

6. The electrostatic discharge protection circuit according to claim 5, wherein the first electrostatic discharge current is less than the second electrostatic discharge current.

7. The electrostatic discharge protection circuit according to claim 4, wherein a channel width-to-length ratio of the second transistor is greater than a channel width-to-length ratio of the first transistor.

8. The electrostatic discharge protection circuit according to claim 1, wherein the first power rail is for receiving a ground power, and the second power rail is for receiving an operation power.

9. The electrostatic discharge protection circuit according to claim 8, wherein the first transistor is an N-type transistor, and the second transistor is a P-type transistor.

10. The electrostatic discharge protection circuit according to claim 9, wherein when an electrostatic discharge phenomenon occurs in the first power rail, the first resistor delays a speed at which a voltage on the control end of the first transistor rises, and conducts the first transistor to dissipate a first electrostatic discharge current.

11. The electrostatic discharge protection circuit according to claim 10, wherein when the electrostatic discharge phenomenon occurs in the first power rail, the second resistor generates a cross-voltage between the control end and the second end of the second transistor according to the first electrostatic discharge current, and conducts the second transistor to dissipate a second electrostatic discharge current.

12. The electrostatic discharge protection circuit according to claim 10, wherein a channel width-to-length ratio of the second transistor is greater than a channel width-to-length ratio of the first transistor.

13. The electrostatic discharge protection circuit according to claim 9, wherein the first electrostatic discharge current is less than the second electrostatic discharge current.

* * * * *